United States Patent
Mukherjee et al.

(10) Patent No.: US 7,230,486 B2
(45) Date of Patent: Jun. 12, 2007

(54) LOW VOLTAGE CMOS DIFFERENTIAL AMPLIFIER

(75) Inventors: Sugato Mukherjee, Boise, ID (US); Yangsung Joo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 101 days.

(21) Appl. No.: 11/020,757

(22) Filed: Dec. 23, 2004

(65) Prior Publication Data

US 2006/0139097 A1 Jun. 29, 2006

(51) Int. Cl.
*H03F 3/45* (2006.01)

(52) U.S. Cl. ........................ 330/257; 330/253
(58) Field of Classification Search ........... 330/253; 326/66, 68, 70–71, 80, 86, 88; 365/185.21, 365/207
See application file for complete search history.

(56) References Cited

U.S. PATENT DOCUMENTS

| | | | |
|---|---|---|---|
| 5,736,871 A * | 4/1998 | Goto | 326/115 |
| 6,728,151 B2 | 4/2004 | Joo | 365/205 |
| 6,795,361 B2 | 9/2004 | Joo | 365/222 |
| 6,897,684 B2 * | 5/2005 | Oi et al. | 326/86 |
| 2003/0206476 A1 | 11/2003 | Joo | 365/222 |
| 2004/0042305 A1 | 3/2004 | Joo | 365/205 |
| 2004/0246790 A1 | 12/2004 | Joo | 365/200 |

* cited by examiner

*Primary Examiner*—Robert Pascal
*Assistant Examiner*—Hieu Nguyen
(74) *Attorney, Agent, or Firm*—Fletcher Yoder PC

(57) ABSTRACT

A low voltage CMOS differential amplifier is provided. More specifically, there is provided a device comprising a differential pair coupled to a first tail current transistor and to a component wherein the first tail current transistor is configured to provide a tail current to the differential pair and the component is configured to provide a tail current to the differential pair when the first tail current transistor is operating in a triode region or in a cut-off region.

21 Claims, 3 Drawing Sheets

LOW VOLTAGE CMOS DIFFERENTIAL AMPLIFIER

BACKGROUND OF THE INVENTION

1. Field of the Invention

The present invention relates generally to integrated circuits and, more particularly, to integrated circuits implementing CMOS differential amplifiers.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

As most people are aware, an integrated circuit is a highly miniaturized electronic circuit that is typically designed on a semiconductive substrate. Over the last 10 years, considerable attention has been paid to designing smaller, lower-power integrated circuits. These smaller, lower-power integrated circuits are often used in portable electronic devices that rely on battery power, such as cellular phones and laptop computers. As circuit designers research new ways to lower the power consumption of integrated circuits, they are constantly confronted with new challenges that need to be overcome in order to create the integrated circuits that will be part of the next generation computer, cellular phone, or camera.

The fundamental building block of the modern integrated circuit is the transistor. Transistors are generally fabricated on a semiconductive substrate, such as a silicon substrate. Silicon transistors are created by altering the electrical properties of silicon by adding other materials called "dopants" to the silicon. This process is known as doping. In n-type doping, dopants are added to the silicon that provide extra electrons that do not bond with the silicon. These free electrons make n-type silicon an excellent conductor. In p-type doping, silicon is doped with elements that cause an empty space, known as a "hole," to develop in the silicon. Because these holes readily accept electrons from other silicon atoms, p-type silicon is typically also a good conductor.

Even though p-type silicon and n-type silicon are each good conductors, they are not always good conductors when joined. These junctions, called "p-n junctions," are essentially one way streets for current—allowing it to flow in one direction across the junction but not in the other direction. When current can flow across the p-n junction, it is said to be "forward-biased," and when current cannot flow across the p-n junction, it is considered to be "reverse-biased."

A transistor is created by combining two p-n junctions. For example, a transistor might be arranged as either NPN or PNP. In this arrangement, a relatively small current (or voltage, depending on the type of transistor) applied to the center layer will essentially "open up" the transistor and permit a much greater current to flow across the transistor as a whole. In this fashion, transistors can act as switches or as amplifiers.

While there are numerous types of transistors, metal-oxide semiconductor field-effect transistors ("MOSFETs") have been particularly popular over the past few years. One example of this type of MOSFET is known as an n-channel enhancement type MOSFET or NMOS transistor. The NMOS transistor is created by forming two heavily doped n-type regions in a p-type semiconductive substrate (i.e. NPN). These two n-type regions form regions known as the source and drain regions. Next, a thin layer of an oxide insulator may be grown on the surface of the substrate and metal, or another conductor, may be deposited on this oxide to create a gate region. Terminals are then attached to the source region, the drain region, and the gate region to create a semiconductor device with three terminals: the source ("S") terminal, the drain ("D") terminal, and the gate ("G") terminal.

A voltage $V_{gs}$ placed between the gate terminal and the source terminal of the NMOS transistor will create an electrical field in the semiconductive substrate below the gate terminal. This electrical field causes mobile electrons in the source region, the drain region, and the substrate to accumulate and form an n-type conductive channel in the p-type substrate. This conductive channel is known as the "induced channel." This n-type induced channel effectively connects the drain and source regions together and allows a current, $I_d$, to flow from the drain to the source (i.e. opening up the transistor). The voltage $V_{gs}$ that is sufficient to cause enough electrons to accumulate in the channel to form an induced channel (i.e. to open up the channel) is known as the threshold voltage or $V_{th}$.

A transistor operating with a voltage $V_{gs}$ less than the threshold voltage $V_{th}$ is considered to be in the cut-off region because little or no current is able to flow between the drain and the source of the transistor. In many applications, it is preferable that the transistor not be in the cut-off region. One method of keeping a transistor out of the cut-off region is to apply a voltage $V_{gs}$ to the transistor. This process is referred to as biasing. Two methods of biasing a transistor are self-biasing and fixed biasing. A transistor that has been self-biased typically has its gate terminal coupled to either its own drain terminal or to the terminal of another transistor located somewhere else in the circuit. A fixed biased transistor, on the other hand, is typically coupled to a voltage source either directly or through a resistor. In many digital applications, self-biasing is preferred because it is typically results in a more symmetrical digital output.

The voltage $V_{gs}$ is not the only voltage that affects the flow of current between the drain region and the source region. A voltage $V_{ds}$ applied between the drain region and source region will appear as a voltage drop across the length of the induced channel. This means that if the voltage $V_{ds}$ is applied, the voltage along the induced channel may vary from the voltage $V_{gs}$ at the source terminal to the voltage $V_{gs}$ minus $V_{ds}$ at the drain terminal. This voltage change along the length of the induced channel may create a channel that is not a uniform depth. This variation in channel depth can affect the operation of the transistor. For instance, when the voltage $V_{ds}$ is less than the voltage $V_{gs}$ minus $V_{th}$, the depth of the channel (and thus the current through the channel, $I_d$) changes greatly as the voltage $V_{ds}$ changes. Under these conditions, the transistor is operating in a state known as "triode." A transistor operating in the triode state may be referred to as a transistor in the triode region.

However, when the voltage $V_{ds}$ is greater than or equal to the voltage $V_{gs}$ minus $V_{th}$, the current $I_d$ is unaffected by changes in the voltage $V_{ds}$. This state is known as saturation, and a transistor operating in this state is considered to be operating in the saturation region. The voltage $V_{ds}$ at which a transistor enters the saturation region is known as the saturation voltage. Because the voltage $V_{ds}$ to $I_d$ relationship is more stable in the saturation region than in the triode region, it may be preferable to operate a transistor in the saturation region when using the transistor as an amplifier.

A related type of MOSFET, known as p-channel enhancement type MOSFET or PMOS, is created on an n-type substrate with source and drain regions composed of p-type regions (i.e. PNP). PMOS transistors operate very similarly to NMOS transistors except that the threshold voltage is negative (i.e. positive between the source terminal and the gate terminal) and current flows from the source terminal to the drain terminal. Both PMOS and NMOS transistors may be used in circuits that employ Complementary MOS ("CMOS") technology. Because CMOS technology allows circuit designers to employ both NMOS and PMOS transistors, it is one of the primary circuit design technologies in use today.

CMOS transistors (i.e. NMOS and PMOS transistors) can be used in a wide variety of amplifiers and switches. One such use is as a differential amplifier. The differential amplifier is one of the most widely used components in analog circuits. Among other things, it is typically used in CMOS input buffers, in some types of video amplifiers, and in balanced line receivers for digital data transmission. CMOS differential amplifiers have been an important part of the rapid growth of CMOS technologies over the past few years.

Generally, a differential amplifier has two voltage inputs, referred to as $V_{ref}$ and $V_{in}$, and one voltage output, referred to as $V_{out}$. Each of the inputs of the differential amplifier is sensitive to the other input. If $V_{in}$ is greater than $V_{ref}$, then $V_{out}$ may be a first voltage level. If, however, $V_{ref}$ is greater than $V_{in}$, $V_{out}$ may be a second voltage level (typically a higher voltage level). This relationship permits the differential amplifier to "detect" the voltage relationship between $V_{ref}$ and $V_{in}$. More specifically, a typical MOSFET differential pair consists of two NMOS transistors or two PMOS transistors. An input voltage $V_{ref}$ may be coupled to the gate terminal of one of these transistors and an input voltage $V_{in}$ may be coupled to the gate terminal of the other transistor. The differential pair may be typically coupled to a tail current source. If $V_{in}$ is greater than $V_{ref}$, the increased voltage at the gate terminal of $V_{in}$ transistor will lower the amount of current that can flow through that $V_{in}$ transistor compared to the amount of current that can flow through the $V_{ref}$ transistor. When this happens, the current from the tail current source may not divide evenly, and this difference in tail current may result in a $V_{out}$ at a low voltage level. Alternatively, if $V_{ref}$ is greater than $V_{in}$, the amount of current that can flow through the $V_{ref}$ transistor will be lower than the amount of current that can flow through the $V_{in}$ transistor, which may result in a $V_{out}$ at a high voltage level.

A transistor may be used as the tail current source in the MOSFET differential pair discussed above. If the tail current source transistor is not biased properly, current conduction through the transistor may be reduced or eliminated and current levels through the induced channel may be unstable. Disadvantageously, if the tail current source is improperly biased, the differential amplifier may not function properly. Tail current source transistors are typically biased using the self-biasing techniques previously described. These self-biasing techniques, however, may not be effective at the low supply voltage levels that are typically used in many modern, low-power devices.

Embodiments of the present invention may address one or more of the problems set forth above.

SUMMARY OF THE INVENTION

Certain aspects commensurate in scope with the originally claimed invention are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

Embodiments of the invention provide a method and an apparatus for operating a differential amplifier at low supply voltages. Specifically, in one embodiment, this is accomplished by providing a device comprising a differential pair coupled to a first tail current transistor and a component wherein the first tail current transistor is configured to provide a tail current to the differential pair and the component is configured to provide a tail current to the differential pair when the first tail current transistor is operating in a triode region or in a cut-off region.

In an alternate embodiment of the invention, this is accomplished by providing a device comprising a differential amplifier, wherein the differential amplifier comprises a fixed biased transistor coupled in parallel to a self-biased transistor and wherein the fixed biased transistor and the self-biased transistor are configured to provide a tail current to the differential amplifier.

In still another embodiment of the invention, there is provided a device comprising a PMOS differential amplifier and an NMOS differential amplifier, wherein the NMOS differential amplifier is coupled to the PMOS differential amplifier and wherein the device is configured to operate as an inverter when a supply voltage is below a predetermined threshold.

BRIEF DESCRIPTION OF THE DRAWINGS

Advantages of the invention may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Many conventional self-biased CMOS differential amplifiers fail to operate properly at low supply voltages because their tail current source transistors either enter the triode region or cut off completely. Amongst other things, embodiments of the present invention may improve the operation of CMOS differential amplifiers and other related devices at low supply voltages. In one embodiment, this may be accomplished by adding a fixed biased tail current source transistor or a resistor in parallel with a self-biased tail current source transistor to the differential amplifiers.

Figure 1:
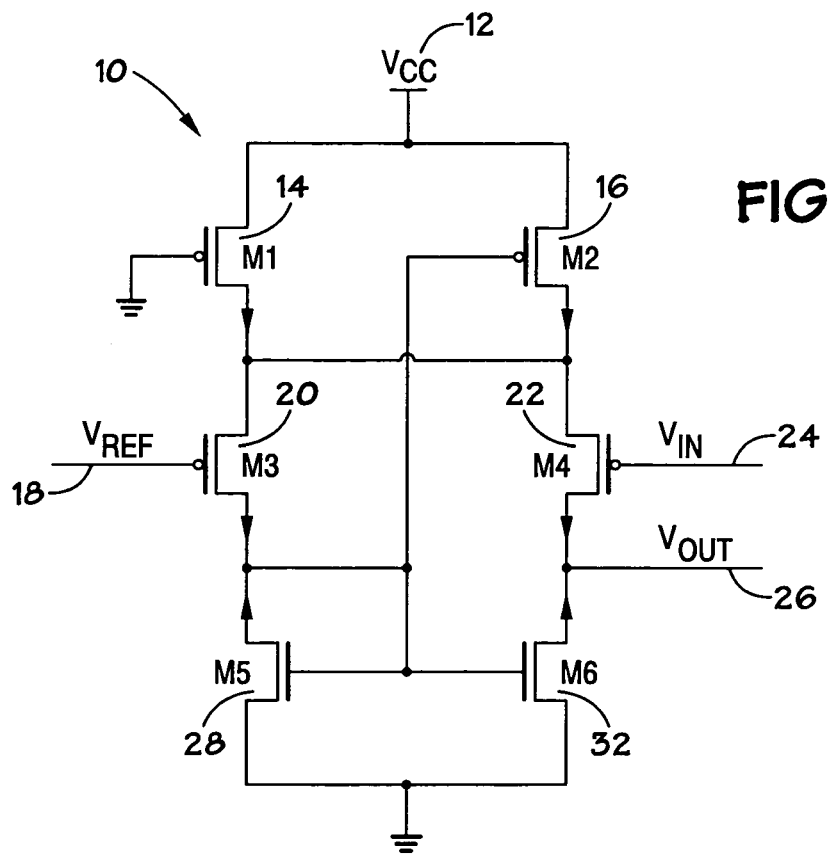
FIG. 1 illustrates a circuit diagram of an exemplary low voltage PMOS differential amplifier in accordance with embodiments of the present invention.

Turning now to the drawings and referring initially to FIG. 1, a circuit diagram of an exemplary low voltage PMOS differential amplifier in accordance with embodiments of the present invention is illustrated and generally designated by a reference numeral 10. The PMOS differential amplifier 10 is comprised of a voltage source Vcc 12 and six transistors M1-M6 14, 16, 20, 24, 28, and 32. The voltage source Vcc 12 may be any desirable type of voltage source and may supply many circuits on a single microchip.

The voltage source Vcc 12 may be coupled to a drain terminal of a fixed biased tail current source transistor 14 (referred to as the transistor M1 14) and to a source terminal of a self-biased tail current source transistor 16 (referred to as the transistor M2 16). The gate terminal of the transistor M1 14 may be coupled to ground, and the drain region of the transistor M1 14 may be coupled to the drain terminal of the transistor M2 16, a source terminal of the transistor M3 20, and a source terminal of the transistor M4 22. The gate terminal of the transistor M2 16 may be coupled to a source terminal of the transistor M5 28, to a gate terminal of the transistor M5 28, and to a gate terminal of the transistor M6 32. The transistor M1 14 may supply less current than the transistor M2 16. In one embodiment there may be a 1:4 ratio of transistor length/width values between the transistor M1 14 and the transistor M2 16. In another embodiment this ratio may be 1:8, and in alternate embodiments, additional transistor size ratios may be implemented to achieve specific design goals. In another embodiment, the fixed biased tail current source transistor 14 may be replaced or supplemented with a resistor.

The transistor M3 20 and the transistor M4 22 may comprise a PMOS differential pair. The transistor M3 20 and the transistor M4 22 may be comprised of two matching CMOS transistors. As depicted in FIG. 1, the PMOS differential pair may have two inputs: a voltage input $V_{ref}$ 18 and a voltage input $V_{in}$ 24. These two voltage inputs (18 and 24) may be respectively coupled to a gate terminal of the transistor M3 20 and a gate terminal of the transistor M4 22. Typically, the value of $V_{ref}$ 18 will be held constant at a known level. This permits the PMOS differential amplifier 10 to produce an output corresponding to a difference between the voltage input $V_{in}$ 24 and the voltage input $V_{ref}$ 18. In this embodiment, a drain terminal of the transistor M4 22 may be coupled to an output $V_{out}$ 26.

In addition to being coupled to the output $V_{out}$ 26, the drain region of transistor M4 22 may also be coupled to the source region of the transistor M6 32. In the embodiment shown in FIG. 1, the M5 28 transistor and the M6 32 transistor are each NMOS transistors that comprise a current mirror. The transistor M5 28 and the transistor M6 32 may be comprised of two matching CMOS transistors. The source terminal of the transistor M5 28 is coupled to the gate terminal of the transistor M5 28, to the gate terminal of the transistor M6 22, and to the gate terminal of the transistor M2 16. Lastly, a drain terminal of the transistor M5 28 and a drain terminal of the transistor M6 32 may be coupled to ground.

To illustrate the operation of the PMOS differential amplifier 10, assume initially that the supply voltage Vcc 12 is high enough that the transistor M2 16 is operating in the saturation region. Applying a voltage to input $V_{in}$ 24 to input $V_{ref}$ 18 may create a voltage between the source terminal and the gate terminal that is greater than the threshold voltage for both the M3 transistor 20 and the transistor M4 22. It is important to note that because the transistor M3 20 and the transistor M4 24 are PMOS transistors the channel will conduct current when the source to gate voltage is greater than the threshold voltage. This is opposite from NMOS transistors, which will be discussed later, in which the channel conducts current when the gate to source voltage is greater than the threshold current. Assuming that both the voltage $V_{ref}$ and the voltage $V_{in}$ are sufficient to bias the source to gate voltage of the transistor M3 20 and the transistor M4 22, the induced channels of the transistor M3 20 and the transistor M4 22 will open to permit the flow of current through the transistors. The amount of current available to flow through the transistor M3 20 and the transistor M4 22 may be determined by the amount of current being produced by the transistor M1 14 and the transistor M2 16 (the tail current source transistors).

Turning next to the operation of the PMOS differential amplifier 10. If the voltage applied to $V_{in}$ is greater than the voltage applied to $V_{ref}$, transistor M3 20 may draw more tail current (i.e., the current at the drain terminal of the transistor M1 14 plus the current at the drain terminal of the transistor M2 16) than the transistor M4 22. Even though these two currents are different, the current mirror created by the transistor M5 28 and the transistor M6 32 will still attempt to equalize the currents at the source terminal of the transistor M5 28 and the source terminal of the transistor M6 32. However, because the current provided by the transistor M4 22 is less than the current provided through the transistor M3 20, a low voltage will be generated at $V_{out}$. Thus, a low $V_{out}$ may indicate that $V_{ref}$ is less than $V_{in}$.

Conversely, $V_{out}$ may be high if $V_{in}$ is less then $V_{ref}$. In this case, transistor M3 20 may draw less tail current (i.e., the current at the drain terminal of the transistor M1 14 plus the current at the drain terminal of the transistor M2 16) than the transistor M4 22. As above, even though these two currents are different, the current mirror created by the transistor M5 28 and the transistor M6 32 will still attempt to equalize the currents at the source terminal of the transistor M5 28 and the source terminal of the transistor M6 32. However, because the current provided by the transistor M4 22 is greater than the current provided through the transistor M3 20, a high voltage will be generated at $V_{out}$. Thus, a high $V_{out}$ may indicate that $V_{ref}$ is greater than $V_{in}$.

As stated above, when the supply voltage Vcc 12 is high, typically, the transistor M2 16 will have no problem supplying sufficient tail current for the PMOS differential amplifier 10 to function properly. Recall from above, that the transistor M2 16 will typically be four to eight times larger than the transistor M1 14. As suggested above, this may be advantageous because self-biased transistors such as the transistor M2 16, are typically able to produce symmetrical digital outputs.

As the supply voltage Vcc 12 decreases, however, the voltage between the source terminal and the gate terminal of the transistor M2 16 may fall below the threshold voltage of the transistor M2 16. If this happens, the transistor M2 16 may enter the triode region or the cut-off region. If the transistor M2 16 were the sole source of tail current in the PMOS differential amplifier 10, this could cause the PMOS differential amplifier 10 to malfunction. In this case, it may be necessary to add additional components to compensate for the malfunctioning differential amplifier. In one conventional embodiment, this was done by adding a transistor/transistor logic based ("TTL") buffer in parallel with the differential amplifier. While effective, adding a TTL buffer disadvantageously slowed down the operation of the circuit. In addition, the added TTL buffer also occupies more area on the circuit itself. Further, adding a TTL buffer also disadvantageously requires the addition of an extra mode to select between the differential amplifier and the TTL buffer.

The PMOS differential amplifier 10, on the contrary, is able to function properly at low supply voltages without an additional buffer. Even though the transistor M2 16 (self-biased) may enter the triode region at lower supply voltages, the transistor M1 14 (fixed biased) will remain in the stable saturation region even at lower supply voltages. As depicted in FIG. 1, the source terminal of the transistor M1 14 is coupled to the voltage supply Vcc 12, and the gate terminal of the transistor M1 14 is coupled to ground. Unlike the transistor M2 16, the source to gate voltage may depend solely on the supply voltage Vcc 12. As such, even at lower supply voltages, the source to gate voltage will typically be above the threshold voltage of the transistor M1 14. As described above, in an alternate embodiment, the transistor M1 14 may be replaced or supplemented with a resistor.

For example, assume that the threshold voltage of both the transistor M1 14 and the transistor M2 16 is 0.4–0.5 volts and the supply voltage Vcc 12 is 1.2 volts. In this case, if the voltage on the gate terminal of the transistor M2 16 exceeds 0.7 volts, the transistor M2 may enter the triode region or the cut-off region (because the voltage between the source terminal and the gate terminal will be less than the threshold voltage of 0.5 volts). On the contrary, at the same supply voltage of 1.2 volts, the voltage between the source terminal and the gate terminal of the transistor M1 14 will be 1.2 volts (i.e. the source to gate voltage will match the voltage source Vcc 12). In another embodiment of the invention, the transistor M1 14 may supply over 90% of the tail current when the supply voltage Vcc 12 is less than 1.3V. In this way, the PMOS differential amplifier 10 may be able to function properly even at lower supply voltages.

Figure 2:
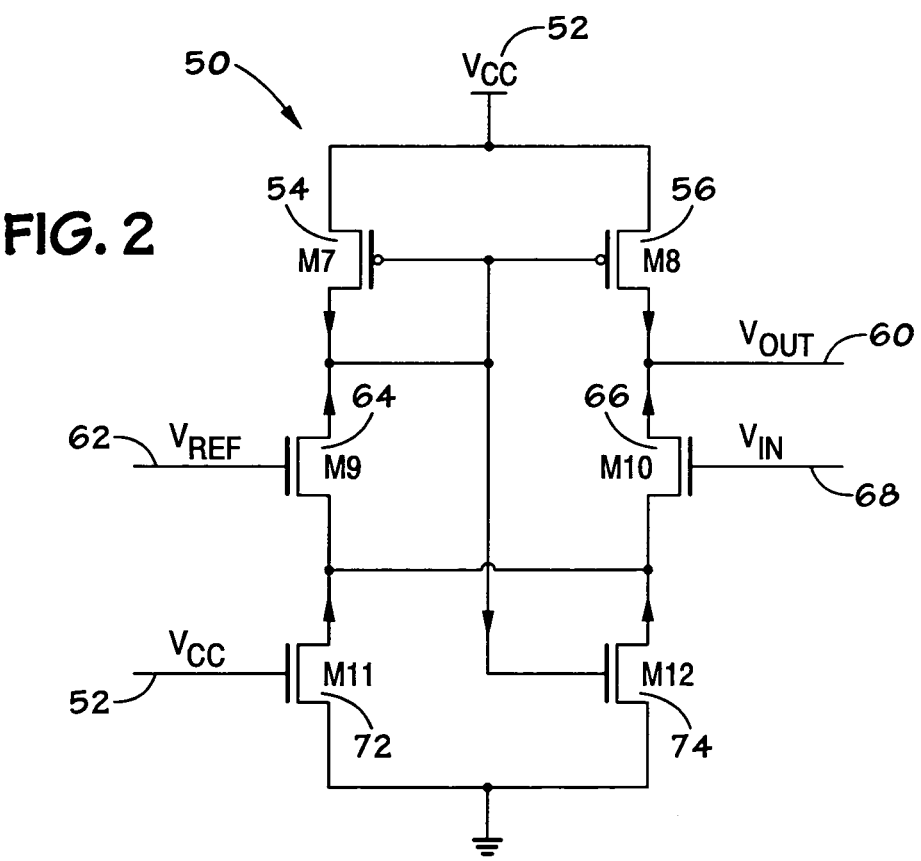
FIG. 2 illustrates a circuit diagram of an exemplary low voltage NMOS differential amplifier in accordance with embodiments of the present invention.

Turning next to FIG. 2, a circuit diagram illustrating an exemplary low voltage NMOS differential amplifier in accordance with embodiments of the present invention is depicted and generally designated by a reference numeral 50. The NMOS differential amplifier 50 functions substantially similar to the PMOS differential amplifier 10 depicted in FIG. 1. There are, however, several distinct differences. The NMOS differential amplifier 50 may include a voltage source Vcc 52 and six CMOS transistors M7–M12 54, 56, 64, 66, 72, and 74. As with the voltage source Vcc 12 described in relation to FIG. 1, the voltage source Vcc 52 may be virtually any type of voltage source and may supply numerous circuits on a single microchip.

The function of each of the transistors in the NMOS differential amplifier 50 may be essentially a mirror image of the function of each of the transistors in the PMOS differential amplifier 10 depicted in FIG. 1. Specifically, the transistor M7 54 and the transistor M8 56 may be PMOS transistors that comprise a current mirror. These transistors may be coupled to an NMOS differential pair comprised of the transistor M9 64 and the transistor M10 66. Similar to the PMOS differential amplifier 10, the transistor M9 64 may be coupled to an input voltage $V_{ref}$ 62, and the transistor M10 66 may be coupled to an input voltage $V_{in}$ 68. This NMOS differential pair in turn may be coupled to two tail current source transistors, the transistor M1 72 and the transistor M2 74. The transistor M1 72 may be a fixed biased transistor and thus its gate terminal may be coupled to the supply voltage Vcc 52. In alternate embodiments, the gate terminal of the transistor M11 72 may be coupled to an alternate voltage source. The transistor M12 74 may be a self-biased transistor and may be coupled to a gate terminal of the transistor M7 54 and a gate terminal of the transistor M8 56.

The NMOS differential amplifier 50 may function similarly to the PMOS differential amplifier 10 depicted in FIG. 1. Specifically, when the input voltage $V_{ref}$ 62 is greater than the input voltage $V_{in}$ 68, the voltage $V_{out}$ 60 may be low. However, if the input voltage $V_{in}$ 68 is less than the input voltage $V_{ref}$ 62, the voltage $V_{out}$ 60 may be high. In this way, similar to the PMOS differential amplifier 10, the NMOS differential amplifier 50 may be able to detect the relationship between the voltage $V_{in}$ 68 and the voltage $V_{ref}$ 62.

The tail current source transistors in the NMOS differential amplifier 50 also function similarly to those described in relation to the PMOS differential amplifier 10 in FIG. 1. As before, the NMOS differential amplifier 50 has one self-biased tail current source transistor, i.e., the transistor M12 74, and one fixed biased tail current source transistor, i.e., the transistor M11 72. The transistor M12 74 will typically conduct four to eight times more current in its saturation region than the transistor M11 72, although virtually any ratio of currents is possible depending on the design goals. As with the PMOS differential amplifier 10, at higher supply voltages the transistor M12 74 may provide the bulk of the tail current. However, as the supply voltage drops, the transistor M12 74 may enter its triode region and may not be able to supply a stable tail current. In this case, the transistor M11 72 may still be able to continue to supply a tail current because the gate terminal of the transistor M11 72 may be coupled to the voltage source Vcc 52, and the source terminal of the transistor M11 72 may be coupled to ground. Thus, as long as the supply voltage Vcc 52 remains higher than the threshold voltage of the transistor M11 72, the NMOS differential amplifier 50 may be able to function properly. Because the threshold voltage of the typical transistor M11 72 is well below what is typically considered a low supply voltage, the above-described features permit the NMOS differential amplifier 50 to function properly even at low supply voltages.

As stated above in the background section, one of the primary uses for differential amplifiers, such as the PMOS differential amplifier 10 or the NMOS differential amplifier 50 is in complementary differential amplifier input buffers complementary differential amplifier input buffers are typically used to convert low voltage swing input signals at the input pins of an integrated circuit to a full digital (i.e. logic) voltage level that can be used inside the integrated circuit. Typically, complementary differential amplifier input buffers are used in memory chips, such as dynamic random access memory ("DRAM") or static random access memory ("SRAM"), in flash memory, in processors, or in microcontrollers. Those skilled in the art, however, will appreciate that complementary differential amplifier input buffers may be used in a wide variety of applications in addition to those listed above.

Figure 3:
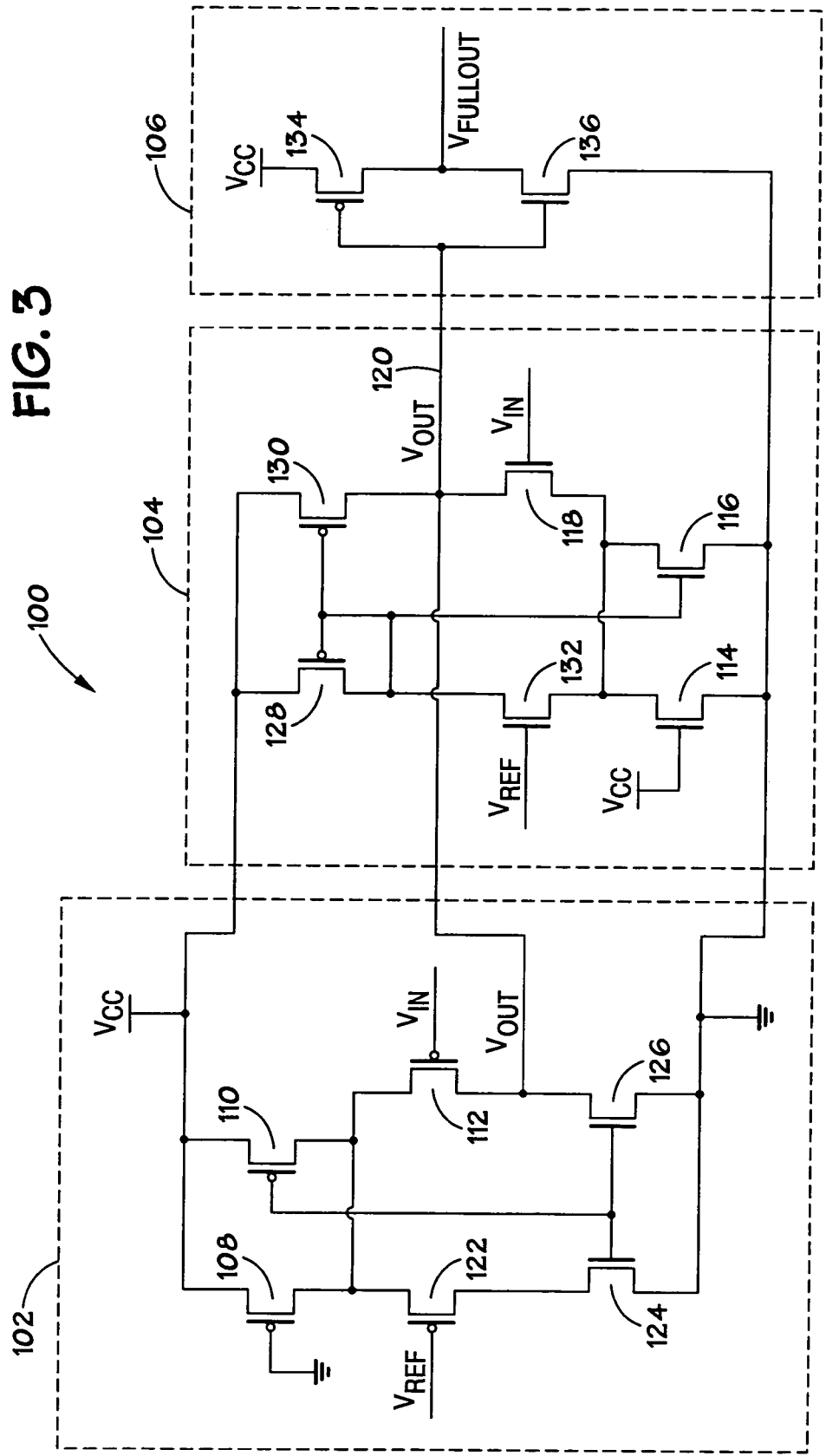
FIG. 3 illustrates a circuit diagram of an exemplary complimentary differential amplifier input buffer in accordance with embodiments of the present invention.

Returning now to the drawings and referring to FIG. 3, a schematic diagram of an exemplary complementary differential amplifier input buffer in accordance with embodiments of the present invention is depicted and generally designated by a reference numeral 100. The complementary differential amplifier input buffer 100 includes a PMOS differential amplifier 102, an NMOS differential amplifier 104, and an inverter 106. The PMOS differential amplifier 102 may function similarly to the PMOS differential amplifier 10 depicted in FIG. 1, and the NMOS differential amplifier 104 may function similarly to the NMOS differential amplifier 50 depicted in FIG. 2. The outputs of the PMOS differential amplifier 102 and the NMOS differential amplifier 104 may be coupled together to create a combined output $V_{out}$ 120 in order to maximize the common mode range of the complementary differential amplifier input buffer 100. The common mode range is the range of input voltages over which a differential amplifier behaves in a linear fashion. The inverter 106 may be coupled to the output $V_{out}$ 120 in order to convert the output $V_{out}$ 120 to a full digital voltage level output, $V_{fullout}$. The inverter 106 may comprise the transistors 134 and 136. Those skilled in the art will appreciate that in alternate embodiments the inverter 106 may be omitted.

Before discussing the low voltage behavior of the complementary differential amplifier input buffer 100, it may be helpful to briefly discuss a conventional method for handing low supply voltages in complementary differential amplifier input buffers. As described above, conventional differential amplifiers may not operate properly at lower supply voltages. Thus, at lower supply voltages, a complementary differential amplifier input buffer having only conventional differential amplifiers may not operate properly. To overcome this potential deficiency, conventional complementary differential amplifier input buffers typically include a TTL inverter coupled in parallel with the differential amplifiers. This TTL inverter is typically able to produce an output at lower supply voltages if the differential amplifiers do not operate properly. However, in addition to other disadvantages, adding this extra TTL inverter in parallel to the conventional PMOS differential amplifier and a conventional NMOS differential amplifier increases the capacitance of the input voltage $V_{in}$, and slows the performance of the conventional complementary differential amplifier input buffer by approximately 100 psec.

Because the PMOS differential amplifier 102 and the NMOS differential amplifier 104 are able to continue functioning even at lower supply voltages, a TTL inverter may not be needed in the complementary differential amplifier input buffer 100. Specifically, when a self-biased tail current source transistor 110 in the PMOS differential amplifier 102 and a self-biased tail current source transistor 116 in the NMOS differential amplifier 104 have both entered the cut-off region, a fixed biased tail current source transistor 108 and a voltage input transistor 112 in the PMOS differential pair 102 combine with a fixed biased tail current source transistor 114 and input voltage transistor 118 in the NMOS differential amplifier 104 to function like an inverter. In terms of digital logic, the transistor 108 and the transistor 114 operate as switches which are turned on. The input signal is connected to the gate terminal of the transistor 112 and the transistor 118 which have their drain terminals coupled together. This creates the inverter. Because this inverter functions at low supply voltages, it may obviate the need for a separate TTL inverter and thus increase the operating speed of the complementary differential amplifier input buffer 100 over conventional complementary differential amplifier input buffers. The complementary differential amplifier input buffer 100 may also include the transistors 122–132. These transistors may function substantially similar to their respective counterparts discussed above in regard to the PMOS differential amplifier 10 or the NMOS differential amplifier 50. Further, as noted above, in alternate embodiments, the fixed biased tail current source transistors 108 and 114 may be replaced or supplemented with resistors.

Figure 4:
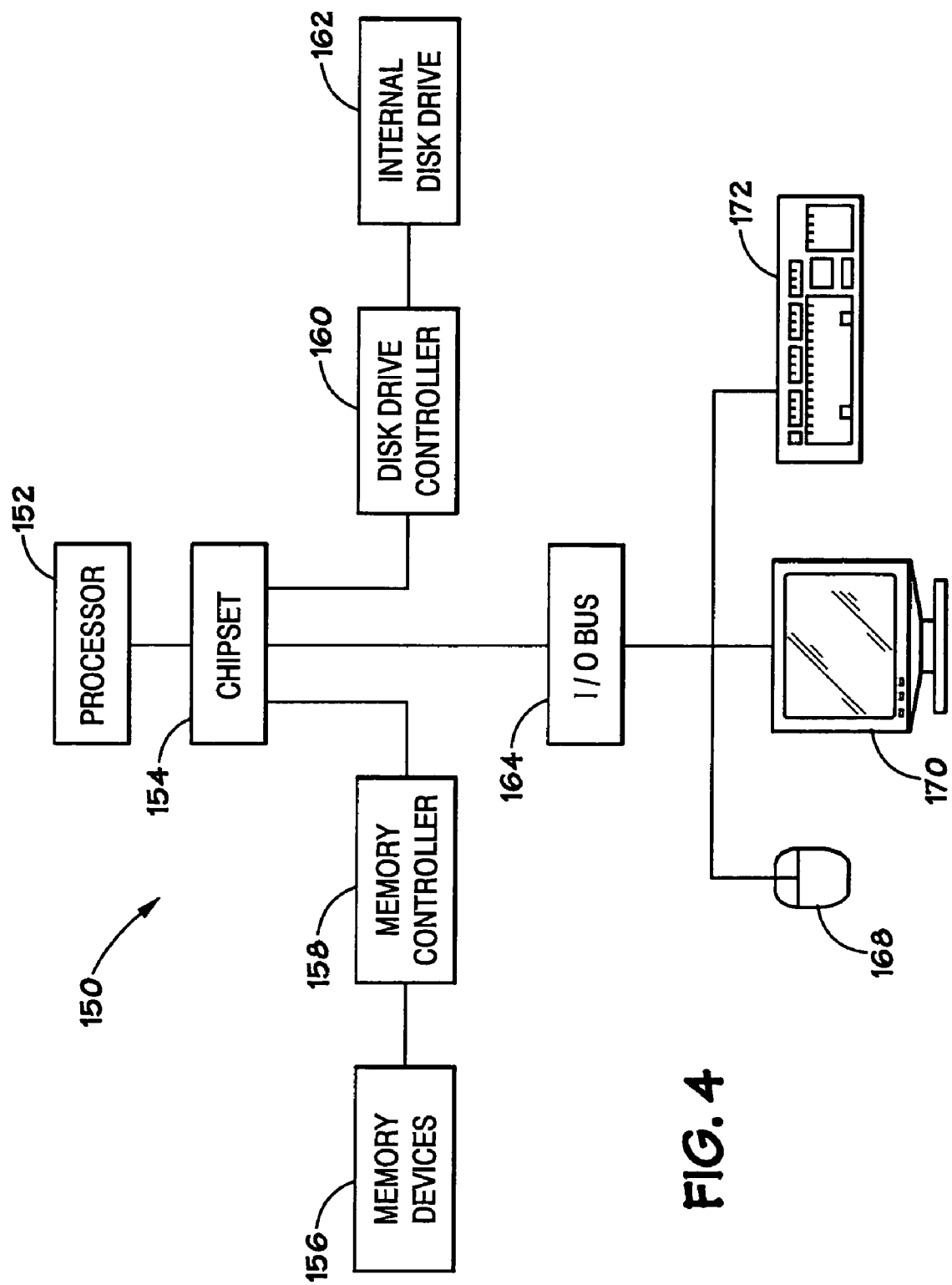
FIG. 4 illustrates a block diagram of an exemplary system employing a low voltage differential amplifier circuit in accordance with embodiments of the present invention.

The differential amplifiers discussed above are particular useful in the design of memory devices, processors, and computer systems. For example, turning back to the drawings and referring to FIG. 4, a block diagram of an exemplary system employing a CMOS differential amplifier in accordance with embodiments of the invention is illustrated and generally designated by a reference numeral 150. The system 150 may include one or more processors or central processing units ("CPUs") 152. The CPU 152 may be used individually or in combination with other CPUs. While the CPU 152 will be referred to primarily in the singular, it will be understood by those skilled in the art that a system with any number of physical or logical CPUs may be implemented. Examples of suitable CPUs include the Intel Pentium 4 processor and the AMD Athelon processor. In one embodiment of the invention, the CPU 152 may employ the complementary differential amplifier input buffer amplifier described in reference to FIG. 3 or the differential amplifier described above in reference to FIGS. 1 and 2.

A chipset 14 may be operably coupled to the CPU 152. The chipset 154 is a communication pathway for signals between the CPU 152 and other components of the system 150, which may include, a memory controller 158, an input/output ("I/O") bus 164, and a disk drive controller 160. Depending on the configuration of the system, any one of a number of different signals may be transmitted through the chipset 154, and those skilled in the art will appreciate that the routing of the signals throughout the system 150 can be readily adjusted without changing the underlying nature of the system.

As stated above, the memory controller 158 may be operably coupled to the chipset 154. In alternate embodiments, the memory controller 158 may be integrated into the chipset 154. The memory controller 158 may be operably coupled to one or more memory devices 156. In one embodiment of the invention, the memory devices 156 may employ the complementary differential amplifier input buffer amplifier described in reference to FIG. 3 or the differential amplifier described in reference to FIGS. 1 and 2. The memory devices 156 may be any one of a number of industry standard memory types, including but not limited to, single inline memory modules ("SIMMs") and dual inline memory modules ("DIMMs"). In certain embodiments of the invention, the memory devices 156 may facilitate the safe removal of the external data storage devices by storing both instructions and data.

The chipset 154 may also be coupled to the I/O bus 164. The I/O bus 162 may serve as a communication pathway for signals from the chipset 154 to I/O devices 168–172. The I/O devices 168–172 may include a mouse 168, a video display 170, or a keyboard 172. The I/O bus 164 may employ any one of a number of communications protocols to communicate with the I/O devices 168–172. In alternate embodiments, the I/O bus 164 may be integrated into the chipset 154.

The disk drive controller 160 may also be operably coupled to the chipset 154. The disk drive controller 160 may serve as the communication pathway between the chipset 154 and one or more internal disk drives 162. In certain embodiments of the invention, the internal disk drive 162 may facilitate disconnection of the external data storage devices by storing both instructions and data. The disk drive controller 160 and the internal disk drives 162 may communicate with each other or with the chipset 154 using virtually any type of communication protocol, including all of those mentioned above with regard to the I/O bus 164.

It is important to note that the system 150 described above in relation to FIG. 4 is merely one example of a system employing a CMOS differential amplifier. In alternate embodiments, such as cellular phones or digital cameras, the components may differ from the embodiment shown in FIG. 4.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A device comprising:
    a differential pair;
    a first transistor, being coupled to the differential pair, and configured to provide a current to the differential pair, wherein the first transistor is self-biased;
    a component, being coupled to the differential pair, and configured to provide the current to the differential pair when the first transistor is operating in a triode region or in a cut-off region; and
    wherein the component is component is configured to provide over 90% of the current to the differential pair when a supply voltage to the first transistor is less than 1.2 volts.

2. The device, as set forth in claim 1, comprising a current mirror coupled to the differential pair.

3. The device, as set forth in claim 1, wherein the differential pair comprises a pair of NMOS transistors.

4. The device, as set forth in claim 1, wherein the component comprises a resistor.

5. The device, as set forth in claim 1, wherein the component comprises a second transistor.

6. The device, as set forth in claim 5, wherein the second transistor comprises a fixed-biased transistor.

7. The device, as set forth in claim 6, comprising a voltage source coupled to the second transistor, wherein the voltage source coupled to the second transistor comprises a voltage source coupled to a gate terminal of the second transistor.

8. The device, as set forth in claim 6, comprising a voltage source coupled to the second transistor, wherein the voltage source coupled to the second transistor comprises the voltage source coupled to a source terminal of the second transistor.

9. A device comprising a differential amplifier, wherein the differential amplifier comprises a fixed biased transistor coupled in parallel to a self-biased transistor and wherein the fixed biased transistor and the self-biased transistor are configured to provide a current to the differential amplifier and wherein the fixed biased transistor is configured to provide over 90% of the current to the differential pair when a supply voltage to the self-biased transistor is less than 1.3 volts.

10. The device, as set forth in claim 9, wherein a gate terminal of the fixed biased transistor is coupled to a supply voltage.

11. The device, as set forth in claim 9, wherein a gate terminal of the fixed biased transistor is coupled to ground.

12. The device, as set forth in claim 9, wherein the device comprises an input buffer.

13. The device, as set forth in claim 9, wherein the device comprises a memory device.

14. The device, as set forth in claim 9, wherein the device comprises a processor.

15. A method of operating a device comprising:
    providing a supply voltage to a differential amplifier;
    biasing a fixed biased transistor disposed on the differential amplifier;
    biasing a self-biased transistor coupled in parallel to the fixed biased transistor; and
    providing a current to a differential pair within the differential amplifier, wherein the current is at least partially provided by the fixed biased transistor and wherein the fixed biased transistor is configured to provide over 90% of the current to the differential pair when a supply voltage to the self-biased transistor is less than 1.3 volts.

16. The method, as set forth in claim 15, wherein providing the current to the differential pair within the differential amplifier comprises providing the current, wherein the current is at least partially provided by the self-biased transistor.

17. A system comprising:
    a processor; and
    a memory device operatively coupled to the processor, the memory device comprising:
    a differential pair;
    a first transistor, being coupled to the differential pair, and configured to provide a current to the differential pair, wherein the first transistor is self-biased;
    a second transistor, being coupled to the differential pair, and configured to provide the current to the differential pair when the first transistor is operating in a triode region; and
    wherein the second transistor is configured to provide over 90% of the current to the differential pair when a supply voltage to the first transistor is less than 1.3 volts.

18. A device comprising:
    a differential pair including a first transistor and a second transistor;
    a third transistor coupled to the first transistor and the second transistor and configured to provide a supply current to the first transistor and the second transistor, wherein the third transistor is self-biased;
    a component, being coupled to the first transistor and the second transistor and configured to provide the supply current to the first transistor and the second transistor when the third transistor is operating in a triode region or in a cut-off region; and
    wherein the second transistor is configured to provide over 90% of the current to the differential pair when a supply voltage to the third transistor is less than 1.3 volts.

19. The device, as set forth in claim 18, wherein the component comprises a resistor.

20. The device, as set forth in claim 18, wherein the component comprises a fixed-biased transistor.

21. The device, as set forth in claim 18, wherein a first input is coupled to a gate terminal of the first transistor and wherein a second input is coupled to a gate terminal of the second transistor.

* * * * *